United States Patent [19]

Ishihara et al.

[11] Patent Number: 5,070,238
[45] Date of Patent: Dec. 3, 1991

[54] ROTARY ENCODER HAVING CIRCULAR MAGNET

[75] Inventors: Yukihiro Ishihara, Kaizuka; Tamotsu Yamamoto, Ashiya; Hiroshi Matsui, Hirakata, all of Japan

[73] Assignee: Matsushita Electric Industrial Co., Ltd., Osaka, Japan

[21] Appl. No.: 499,438

[22] PCT Filed: Oct. 25, 1989

[86] PCT No.: PCT/JP89/01092
§ 371 Date: Jun. 21, 1990
§ 102(e) Date: Jun. 21, 1990

[87] PCT Pub. No.: WO90/04756
PCT Pub. Date: May 3, 1990

[30] Foreign Application Priority Data

Oct. 25, 1988 [JP] Japan .................. 63-268463

[51] Int. Cl.⁵ .............................................. G01D 5/34
[52] U.S. Cl. ........................... 250/231.13; 250/237 G
[58] Field of Search ......... 250/231.13, 231.14–231.18, 250/237 G, 229; 341/13

[56] References Cited

U.S. PATENT DOCUMENTS 4,356,397 10/1982 Lenderking et al. .......... 250/231.13
4,628,199 12/1986 Mueller et al. .................... 250/229

Primary Examiner—David C. Nelms
Assistant Examiner—K. Shami
Attorney, Agent, or Firm—Panitch, Schwarze, Jacobs & Nadel

[57] ABSTRACT

The present invention aims at providing a light-reflecting rotary encoder which is capable of perfectly matching the timing of the clicking detent sensation and pulse signal generation while also guaranteeing a long useful life, and in order to achieve this objective, an optical element and a ring-shaped magnetic plate are provided which oppose a pulse plate made from a sheet of iron material and rotated by an operating shaft, the pulse plate having reflective portions and non-reflective slits. By this means, the pulse plate can be used for both producing the clicking detent sensation and generating the pulse signal, whereby timing shifts due to differences in the precision of manufacturing or shifts in assembling the components can be eliminated. Moreover, since the clicking detent sensation is generated by the ring-shaped magnet and pulse plate, a light-reflecting encoder with a guaranteed long useful life can be provided.

6 Claims, 7 Drawing Sheets

ROTARY ENCODER HAVING CIRCULAR MAGNET

TECHNICAL FIELD

This invention relates to a light-reflecting rotary encoder which is used mainly for editing in video equipment and tuning in radios and generates pulse signals by being rotated.

BACKGROUND ART

FIGS. 9 through 13 show a light-reflecting rotary encoder of the prior art. FIG. 9 is a sectional side view, FIG. 10 is a plan view of a base member which is the principal portion of the rotary encoder in FIG. 9, FIG. 11 is a perspective view of a detent spring of the same, FIG. 12 is a perspective view of a pulse plate of the same, and FIG. 13 is a diagram showing the operation of the same.

In FIGS. 9 through 12, reference numeral 1 denotes a base member made from die cast zinc or other material. A cylindrical support shaft 2 extends perpendicularly up from the center of the disc-shaped bottom surface of the base member, and a circular detent member 3 having protrusions formed continuously in the radial direction at a fixed angular pitch is provided at a fixed radius from the center of the base member.

An operating shaft 4 is rotatably supported on the support shaft 2, and in the vicinity of the lower end thereof, there disposed a detent spring 5 made from a flexible sheet metal and having a flexible contact protrusion 5' for engaging the circular detent member 3 so as to give a clicking detent sensation, and a pulse plate 8 on which glossy light-reflective portions 6 and non-reflective slits 7 are alternately and continuously provided, the number of the glossy light-reflective portions 6 being the same as that of the protrusions on the circular detent member 3. The reference numeral 15 denotes a retainer washer for holding the operating shaft 4 in place.

An optical element 13 of reflective detector type in which a light-emitting element 11 and light-receiving element 12 are arranged side by side is fixed to and has continuity with a conductor plate 10 which is formed inside an insulating substrate 9 fixed on the top surface of the base member 1, so that the optical element 13 opposes the light-reflective portions 6 and slits 7 of the above-mentioned pulse plate 8, the optical element 13 and pulse plate 8 attached to the above-mentioned operating shaft 4 generating pulse signals. The operation of this conventional light-reflecting rotary encoder is described below with reference to FIG. 13.

In the drawing, when the pulse plate 8 is rotated right or left by rotating the operating shaft 4, the light-reflective portions 6 and non-reflective slits 7 alternately face the optical element 13 in agreement with the clicking detent sensation. When the light emitted from the light-emitting element 11 is reflected at the reflective portions 6 of the pulse plate 8, the light-receiving element 12 receives the reflected light and outputs a high level signal to a terminal 14. On the contrary, when the light from the light-emitting element 11 passes through the non-reflective slits 7, a low level signal is output.

Therefore, pulse signals corresponding to the rate of rotation of the operating shaft 4 can be output to the terminal 14 in agreement with the clicking detent sensation.

Furthermore, by providing two optical elements 13 of such a reflective detector type, pulse signals with shifted phases can be output from the optical elements corresponding to the direction of rotation, respectively.

In the above-mentioned light-reflecting rotary encoder, the timing of the clicking detent sensation needs to perfectly match the timing with which the pulse signals are generated in agreement with the clicking detent sensation. In the rotary encoder with the above-mentioned configuration, however, the clicking detent sensation corresponding to the angle of rotation of the rotating shaft 4 is generated by the detent spring 5 at the end of the shaft and the circular detent member 3 on the bottom surface of the base member, while the pulse signals being generated between the pulse plate 8 at the end of the shaft and the optical element 13 attached to the insulating substrate 9. Therefore, since the clicking detent sensation and the pulse signals are respectively generated by assemblies of different components, it has been difficult to adjust the timing of the two due to differences in the precision of components, shifts in assembling the components or the like, and it has been particularly difficult when there were a large number of pulses per rotation.

Also, after long periods of use or after being bumped, a shift is caused between the detent spring 5 and the pulse plate 8.

Moreover, the flexible contact protrusion 5' which is disposed between the detent spring 5 and the circular detent member 3 and generates the clicking detent sensation becomes worn due to friction during rotation, so it has been difficult to guarantee a useful life of greater than 100,000 rotations.

DISCLOSURE OF THE INVENTION

The present invention overcomes these problems and aims at providing an excellent light-reflecting rotary encoder which is capable of perfectly matching the timing of the clicking detent sensation and that of the pulse signal generation while also guaranteeing a long useful life.

In order to achieve this objective, a ring-shaped magnet is added to the design and the pulse plate is made from an iron metal sheet so that a clicking detent sensation is produced by the difference in the magnetic pulling forces on the light-reflective portions and non-reflective slits, whereby the pulse plate generates both the clicking detent sensation and the pulse signals. Since one pulse plate is used to generate both the clicking detent sensation and the pulse signals, shifts in the timing, which are caused between the conventional detent spring and pulse plate, due to differences in the precision of manufacturing components or shifts in assembling the components can be eliminated. Also, since the clicking detent sensation is generated by the ring-shaped magnet and pulse plate, a light-reflecting encoder with a guaranteed long useful life can be provided.

BEST MODE FOR CARRYING OUT THE INVENTION

Embodiments of this invention are described below with reference to the drawings.

EXAMPLE 1

Figure 1:
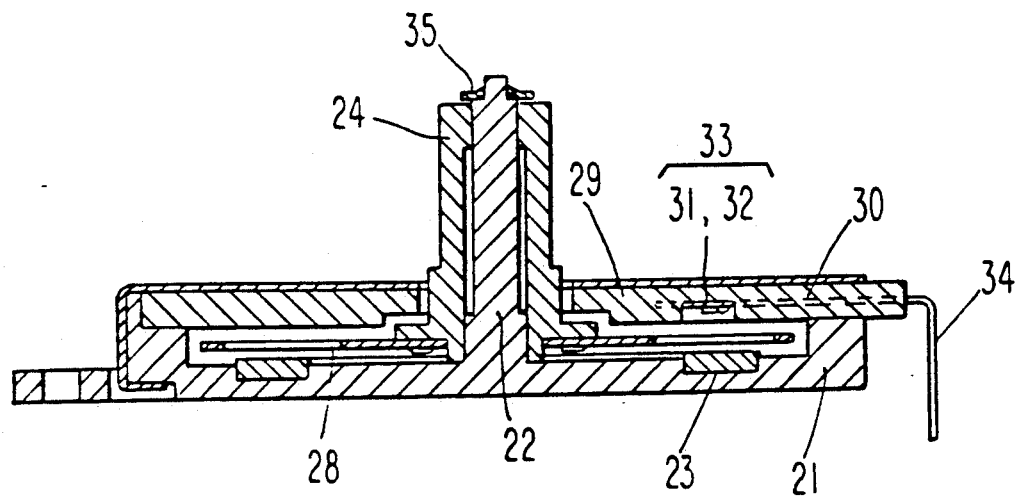
FIG. 1 is a sectional side view of a light-reflecting rotary encoder in one embodiment of this invention.
Figure 2:
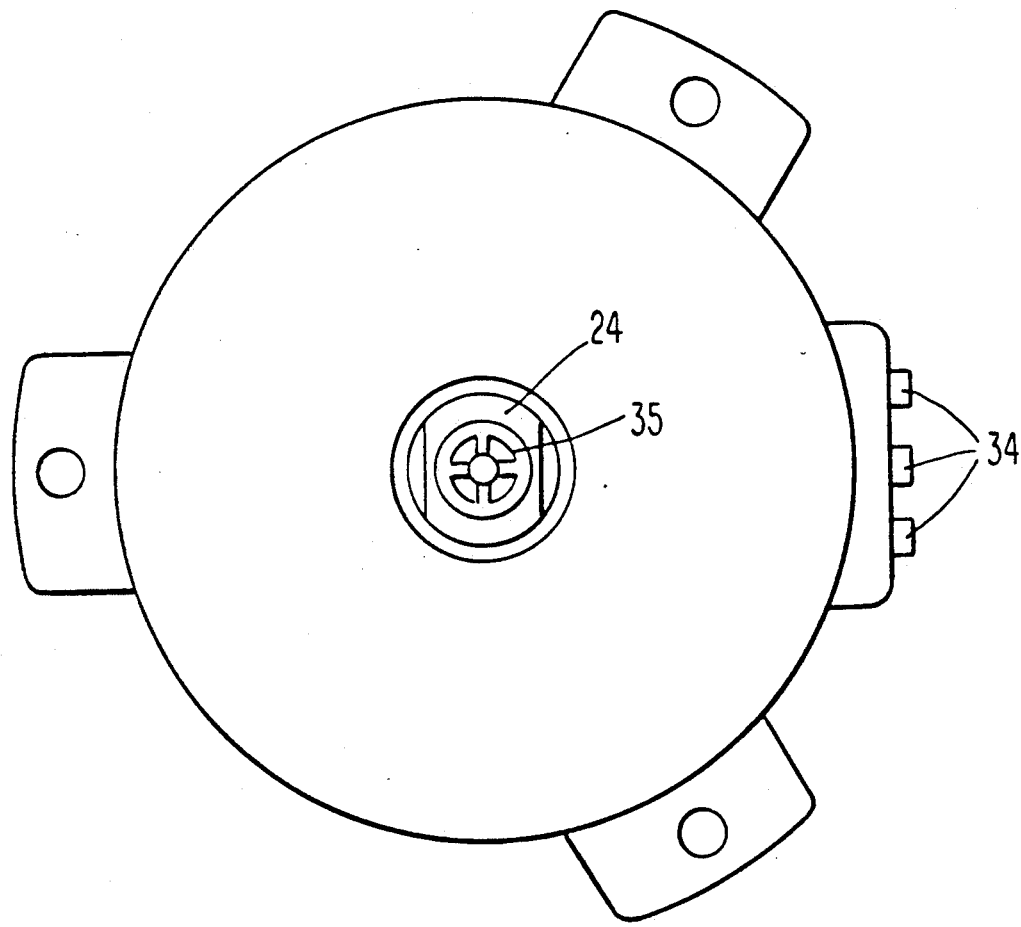
FIG. 2 is a plan view of the embodiment in FIG. 1.
Figure 3:
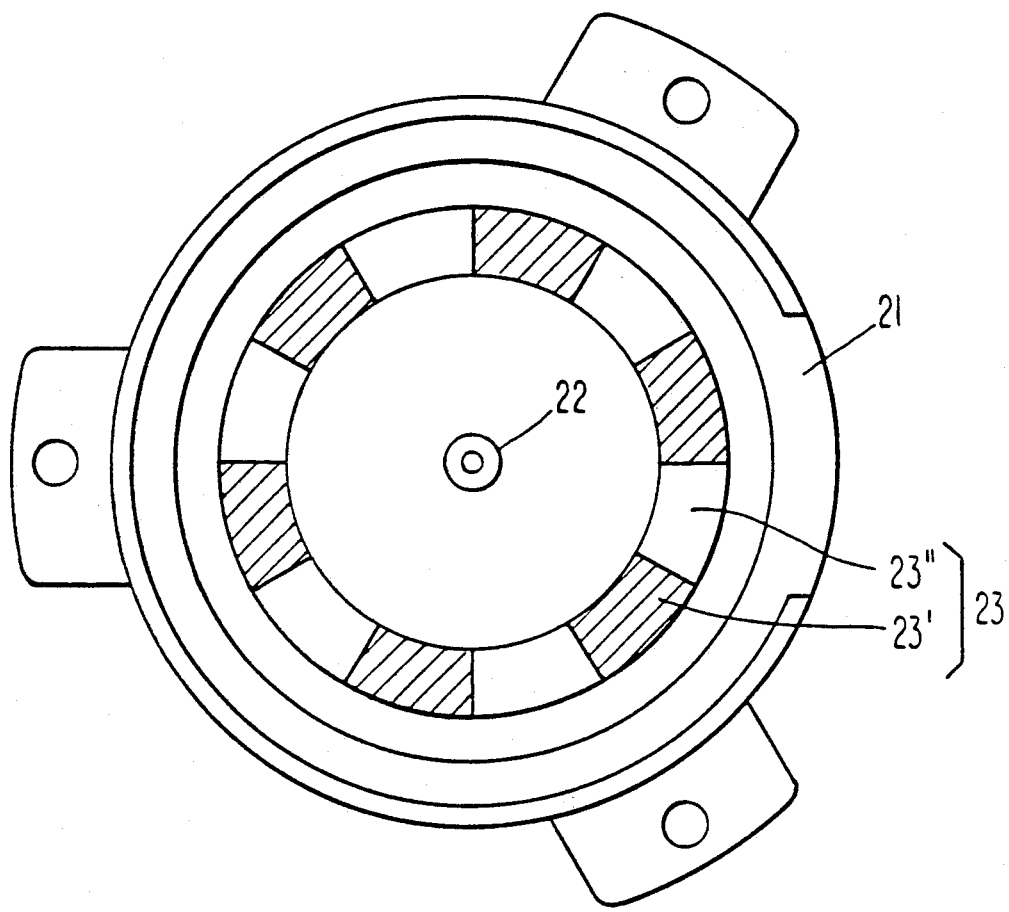
FIG. 3 is a plan view of a ring-shaped magnetic plate, which is a principal part of the embodiment in FIG. 1, and a base member in which the ring-shaped magnetic plate is assembled.
Figure 4:
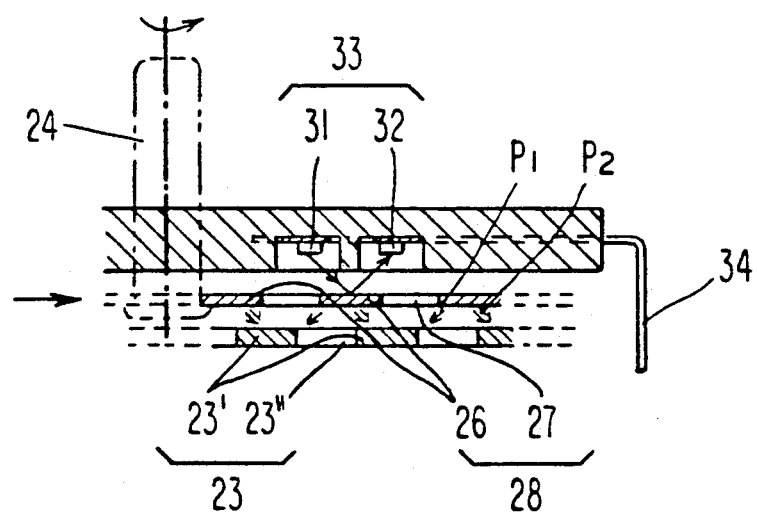
FIG. 4 is a diagram showing the operation of the same.

The first embodiment of the light-reflecting rotary encoder of this invention is described below with reference to FIGS. 1 through 4. FIG. 1 is a sectional side view, FIG. 2 is a plan view, FIG. 3 is a plan view showing a base member in which a ring-shaped magnet, the principal part of the embodiment in FIG. 1, is assembled, and FIG. 4 is a diagram showing the operation of this embodiment. In FIGS. 1 through 4, reference numeral 21 denotes a base member made from a material such as die cast zinc as in the prior art. A cylindrical support shaft 22 extends perpendicularly up from the center of the disc-shaped bottom surface of the base member and a ring-shaped magnetic plate 23 is positioned at a fixed radius from the center of the base member. The ring-shaped magnetic plate 23 is divided into a plurality of equal parts, at which magnetic portions 23' and non-magnetic portions 23'' are alternately disposed.

The support shaft 22 supports an operating shaft 24 rotatably, and in the vicinity of the lower end thereof, a pulse plate 28 which is the same as that of the prior art is provided. On this pulse plate 28, which is made from a thin sheet of glossy iron material, glossy light-reflective portions 26 and non-reflective slits 27 are alternately and continuously positioned at about the same radius as the ring-shaped magnetic plate 23 on the bottom surface of the base member 21, the respective number of the light-reflective portions 26 and the non-reflective slits 27 being the same as that of the magnetic portions 23' on the magnetic plate. The reference numeral 35 is a retainer washer for holding the operating shaft 24 in place.

As in the prior art, an optical element 33 of reflective detector type in which a light-emitting element 31 and light-receiving element 32 are arranged side by side is fixed to and has continuity with a conductor plate 30 which is formed inside an insulating substrate 29 fixed on the upper surface of the base member 21, so that the optical element opposes the light-reflective glossy portions 26 and non-reflective slits 27 of the above-mentioned pulse plate 28. The optical element 33 engages with the pulse plate 28 attached to the above-mentioned operating shaft 24 so as to generate pulse signals.

The operation of the light-reflecting rotary encoder of the first embodiment of this invention is explained with reference to FIG. 4. When the operating shaft 24 is rotated and the pulse plate 28 is turned to the right, it is turned against the pulling force $P_1$ which pulls each of the light-reflective portions 26 of the pulse plate 28 due to the magnetic force of each magnetic portion 23' on the ring-shaped magnet 23. As the pulling force $P_1$ due to the magnetic force of the magnetic portion 23' weakens, the pulling force $P_2$ of the next magnetic portion 23' strengthens. Then, as each of the light-reflective portions 26 passes the midpoint between the magnetic portions 23', the pulling force $P_2$ of the next magnetic portion 23' gradually becomes stronger than $P_1$, resulting in that the pulse plate 28 rotates without the help of any external force to a position where the light-reflective portions 26 oppose the next magnetic portions 23', respectively. The hand of the person rotating the operating shaft 24 at this time senses a click, and electrically, the light-reflective portion 26 and the non-reflective slit 27 of the pulse plate 28 passes by the optical element 33 one by one, which outputs a pulse signal to terminals 34 in the same manner as in the prior art. Of course, the same thing occurs when the operating shaft is rotated to the left.

In addition, in order to prevent a drop in the output of the pulse signal when light from the light-emitting element 31 is reflected on the surface of the ring-shaped magnetic plate 23 after the light passes through the non-reflective slit 27 of the pulse plate 28, the top surface of the ring magnet is colored a flat black. Also, by disposing two optical elements 33 and outputting signals with shifted phases according to the direction of rotation, it is possible to distinguish the direction of rotation together with the pulse signals.

EXAMPLE 2

The second embodiment of the light-reflective rotary encoder of this invention is explained below with reference to FIGS. 5 through 8.

Figure 5:
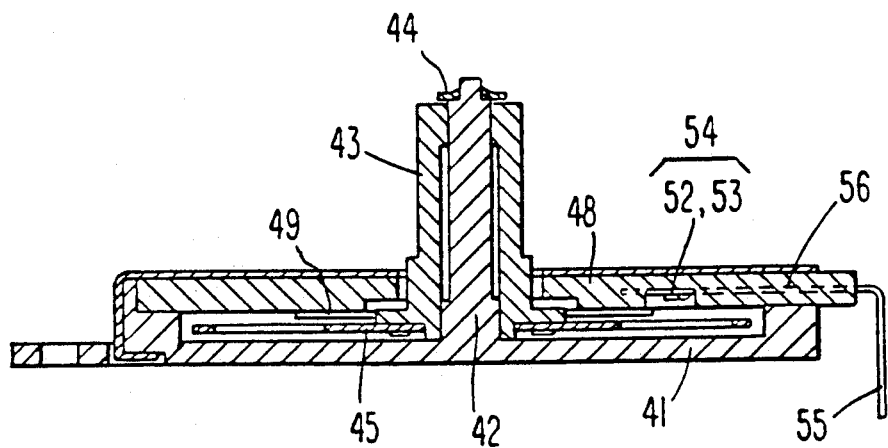
FIG. 5 is a sectional side view of a light-reflecting rotary encoder in another embodiment of this invention.
Figure 6:
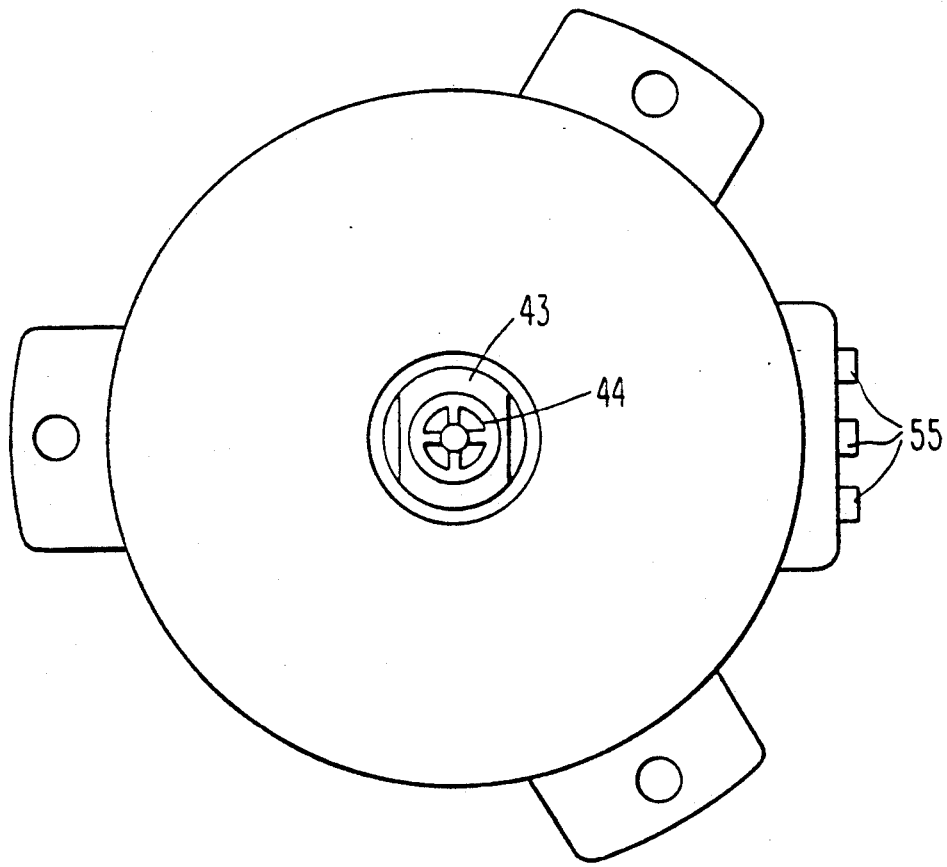
FIG. 6 is a plan view of the embodiment in FIG. 5.
Figure 7:
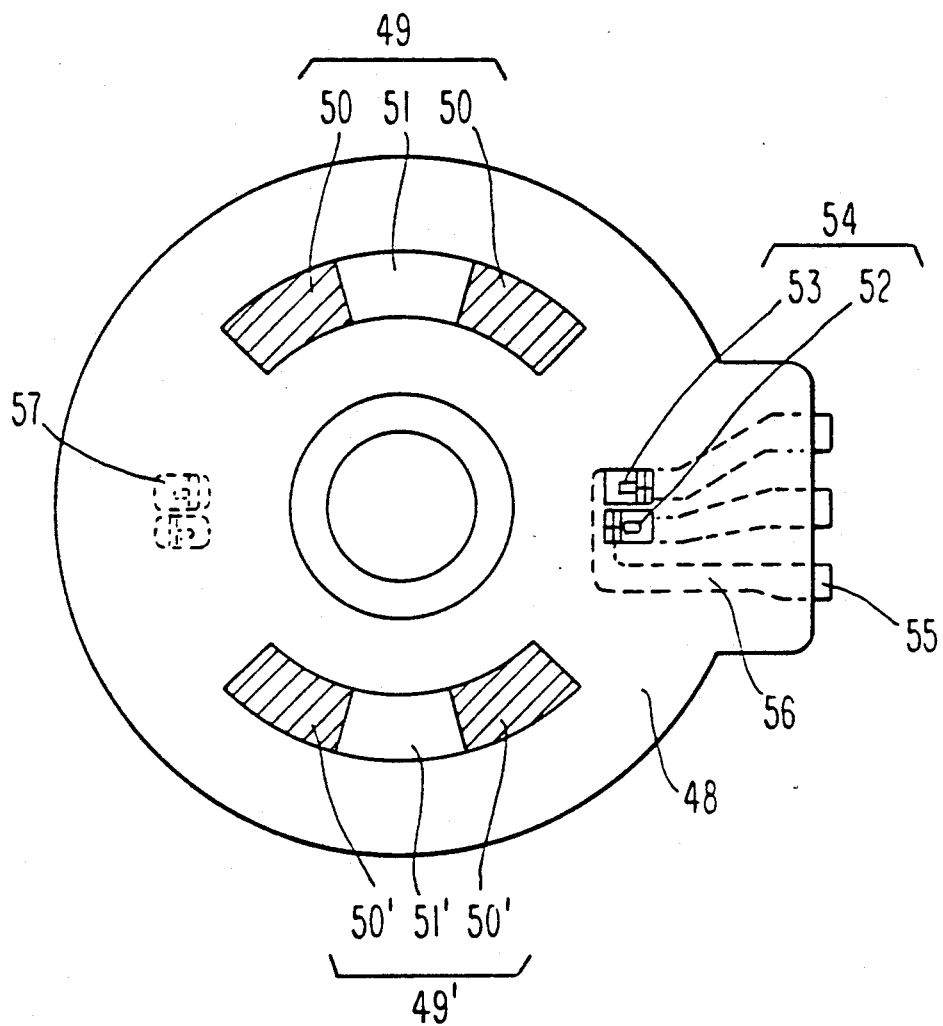
FIG. 7 is a plan view of an insulating substrate looking from the bottom and showing the arrangement of components.
Figure 8:
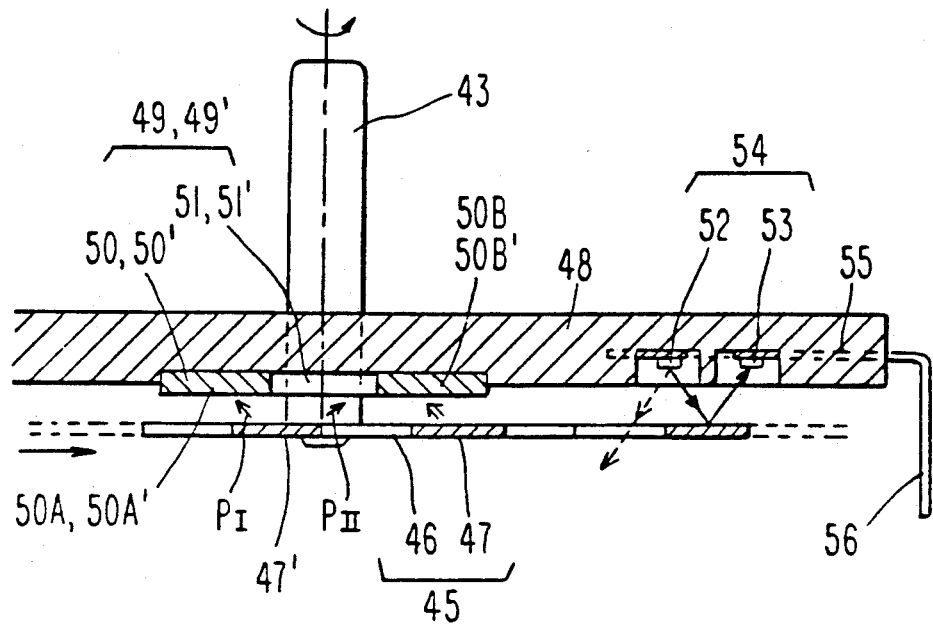
FIG. 8 is a diagram showing the operation of the same.
Figure 9:
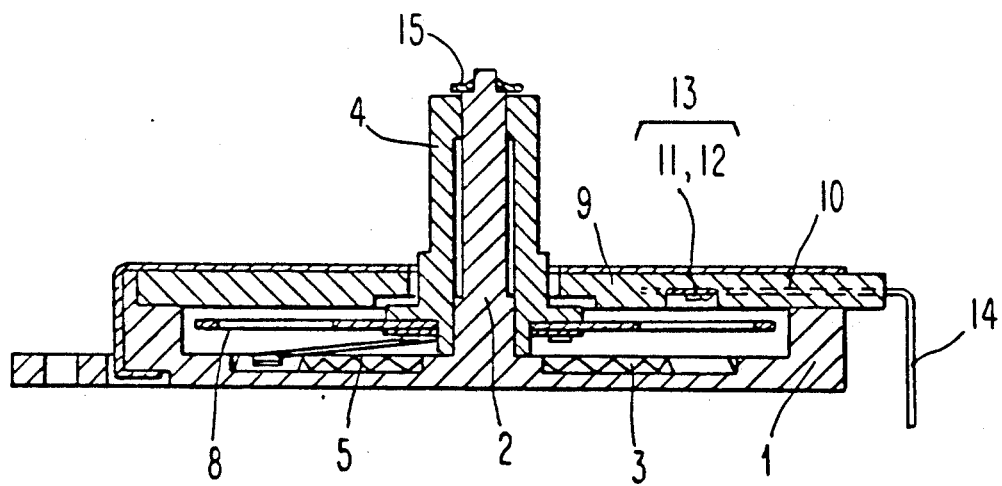
FIG. 9 is a sectional side view of a light-reflecting rotary encoder of the prior art.
Figure 10:
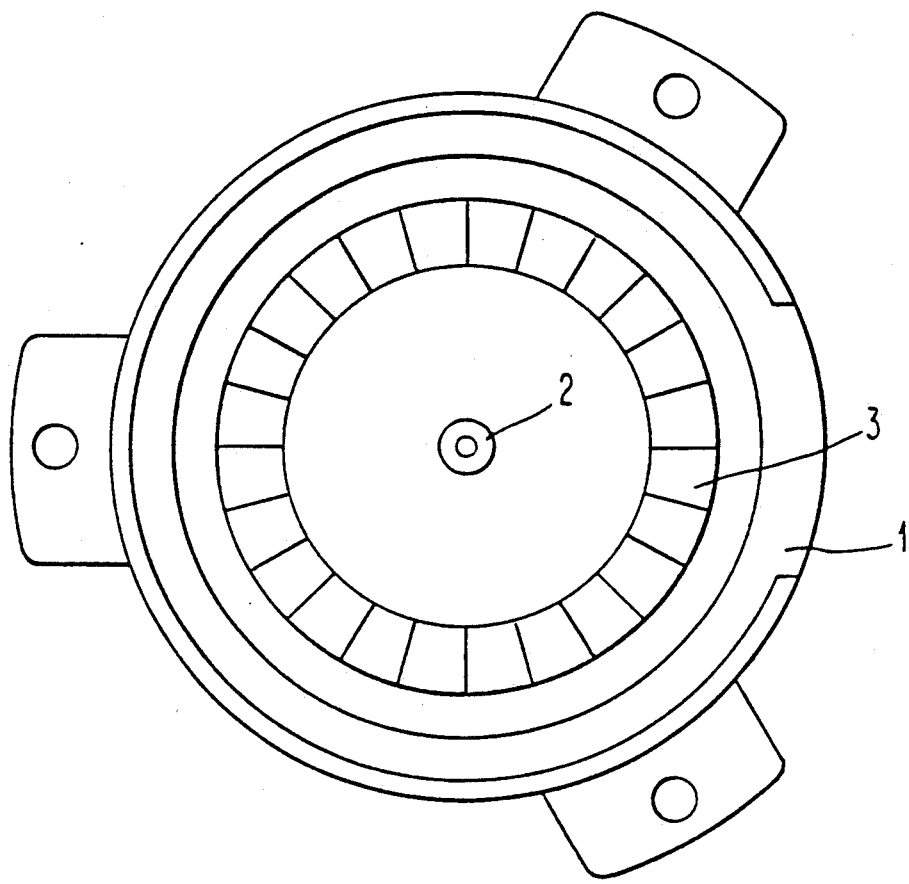
FIG. 10 is a plan view of a base member which is a principal part of the embodiment in FIG. 9.
Figure 11:
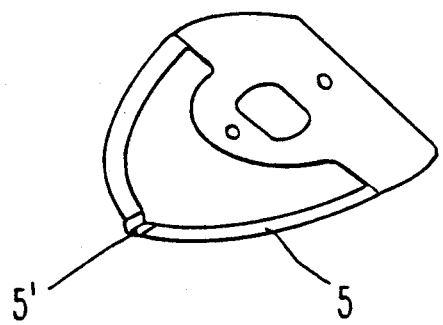
FIG. 11 is a perspective view of a detent spring of the same.
Figure 12:
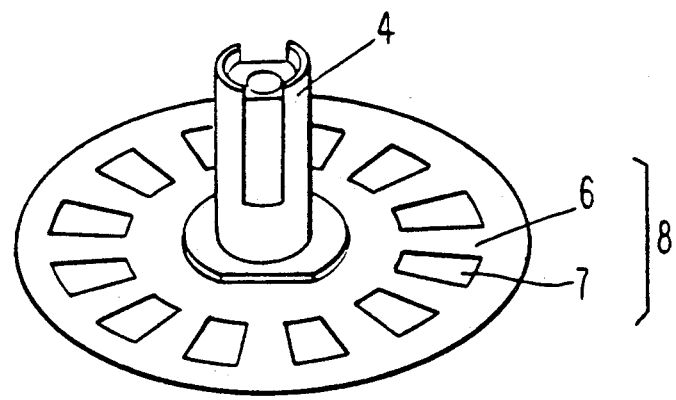
FIG. 12 is a perspective view of a pulse plate of the same.
Figure 13:
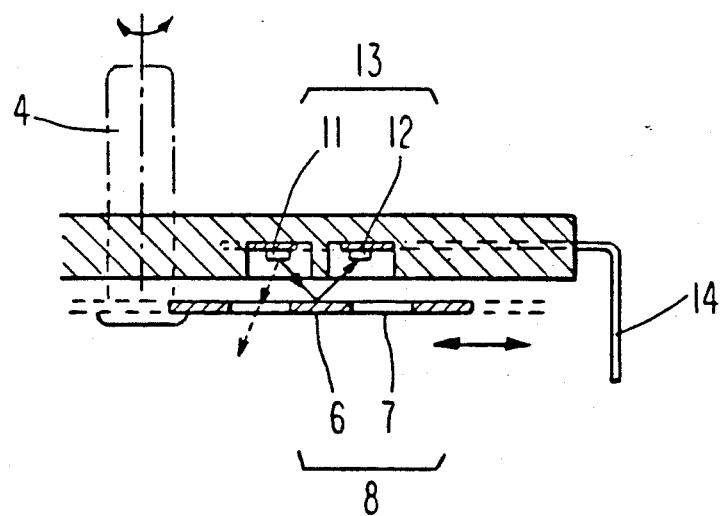
FIG. 13 is a diagram showing the operation of the same.

FIG. 5 is a sectional side view, FIG. 6 is a plan view of the rotary encoder of FIG. 5, FIG. 7 is a plan view looking up from the bottom of an insulating substrate and showing the arrangement of components of the same, and FIG. 8 is a diagram showing the operation of the same. In FIGS. 5 through 8, reference numeral 41 denotes a base member made from a material such as die cast zinc as in the prior art. A cylindrical support shaft 42 extending perpendicularly up from the center of the disc-shaped bottom surface of the base member supports an operating shaft 43 rotatably, the operating shaft being secured in place by a retainer washer 44.

A circular pulse plate 45 made from a thin sheet of iron material is attached in the vicinity of the lower end of the operating shaft 43. This circular pulse plate 45 is radially divided into fan-shaped equal portions in the same manner as in the prior art, and half of them serve as non-reflective slits 46 while the other half serve as light-reflective portions 47 having glossy upper surfaces.

On an insulating substrate 48 fixed to the top surface of the base member 41, an annulus which is defined by almost the same inner and outer radii as the non-reflective slits 46 and light-reflective portions 47 of the above-mentioned circular pulse plate 45 is divided into four equal parts, and at two of them opposing to each other, two fan-shaped magnetic plates 49 and 49' are respectively attached so as to face the circular pulse plate 45. In addition to having nearly the same inner and outer radii as the non-reflective slits 46 and light-reflective portions 47 on the circular pulse plate 45, these two fan-shaped magnetic plates 49 and 49' comprise magnetic portions 50 and 50' and non-magnetic portions 51 and 51', respectively, which have the same angle of pitch as the non-reflective slits 46 and light-reflective portions 47.

An optical element 54 of reflective detector type in which a light-emitting element 52 and light-receiving element 53 are arranged side by side is attached to the insulating substrate 48 and between the two fan-shaped magnetic plates 49 and 49' so that the optical element opposes the non-reflective slits 46 and light-reflective portions 47 on the circular pulse plate 45. The optical element 54 is fixed to and has continuity with a conductor plate 56 which has continuity with terminals 55.

The operation of the light-reflecting rotary encoder of the second embodiment of this invention is explained referring to FIG. 8. When the operating shaft 43 is rotated so as to turn the pulse plate 45, the pulse plate 45 turns against the pulling force which pulls each of the light-reflective portions 47 of the circular pulse plate 45 due to the magnetic force of each of the magnetic portions 30 and 30' of the fan-shaped magnetic plates 49 and 49'. Taking a case of one light-reflective portion 47, as the pulling force $P_I$ of the magnetic portions 50A or 50A' weakens, the force $P_{II}$ of the next magnetic portions 50B or 50B' strengthens, and when the light-reflective portion 47 passes the midpoint between the magnetic portions 50A and 50B (50A' and 50B'), or 30A and 30B (30A' and 30B'), $P_{II}$ becomes stronger than $P_I$ and the circular pulse plate 45 rotates without the help of any external force to a position where the light-reflective portion 47 oppose the next magnetic portions 50 or 50'. The hand of the operator at this time senses the clicking detent and a pulse signal can be output to the terminals 55 in the same manner as in the prior art.

The clicking detent sensation in this embodiment is weaker than in the prior art due to the smaller number of magnetic portions on the magnetic plates, but this can be changed by increasing the magnetic density of each magnetic portion or decreasing the distance between the magnetic plate and the circular pulse plate.

As indicated by the dashed lines in FIG. 7, it is possible to dispose another optical element 57 between the fan-shaped magnetic plates 49 and 49' and on the opposite side to the optical element 54.

In the above embodiment, the fan-shaped magnetic plates 49 and 49' for producing the clicking detent sensation and the optical element 54 for generating pulse signals were attached to the insulating substrate 48 above the top surface of the circular pulse plate, but it is possible to form the base member from an insulating material and attach the fan-shaped magnetic plates and optical element to the circular bottom surface below the circular pulse plate.

In addition, the above embodiment used two fan-shaped magnetic plates which are provided by dividing an annulus equally, but it is also possible to use three or four plates.

Compared to the first embodiment shown in FIGS. 1 through 4, the second embodiment shown in FIGS. 5 through 8 has the following advantages:

(1) Since both of the magnetic plates for generating a clicking detent and the optical element for generating pulse signals are disposed on either the upper or lower surface of the circular pulse plate, the box-like base member or insulating substrate on the side of the pulse plate to which the above magnetic plates and optical element are not attached can be made flat and thin.

(2) The gap between the circular pulse plate and the box-like member need to be controlled only on the side to which the magnetic plates and optical element are attached, and the gap on the opposite side can be made small.

(3) By implementing (1) and (2) mentioned above, the total height of the encoder can be reduced.

(4) Since the magnetic plates for clicking detent and the optical element for generating pulse signals are arranged on the same surface, shifts in the timing of the clicking detent and pulse signal generation which are caused by the shifts in assembling the components hardly occur as compared with the case in which they are arranged on separate surfaces.

Industrial Applicability

As described above, this invention has the following features:

(1) The pulse plate is made from a sheet of iron material, and the clicking detent sensation is produced by the difference in magnetic pulling forces on the light-reflective portions and the non-reflective slits while the pulse signals are generated by detecting whether the light from the light-emitting element of the optical element is reflected by the light-reflective portions or passes through the non-reflective slits of the same pulse plate, so that the timing of the clicking detent sensation and pulse signal generation always agree.

(2) As described above, clicking detent is produced not by contacting some of the components but by utilizing magnetic forces, so that there is no deterioration in the clicking detent sensation due to friction or the like.

(3) Since the clicking detent sensation is produced by the difference in magnetic pulling forces on the light-reflective portions and non-reflective slits continuously disposed on the pulse plate, the pulse plate is always being pulled by the magnetic forces and the light-reflective portions tend to be pulled to the nearer one of the adjacent magnetic portions on the ring-shaped magnetic plate. Therefore, the pulse plate does not stop at non-magnetic portions between adjacent magnetic portions and a smooth clicking sensation can be obtained.

(4) By using a ring-shaped magnetic plate on which magnetic portions and non-magnetic portions are alternately disposed, even when the pulse plate being pulled becomes inclined with respect to the operating shaft, the pulling force of the magnetic plate on the entire pulse plate will not change and the clicking sensation during rotating operation will remain constant as long as the average gap between the magnetic plate and the pulse plate remains constant.

Therefore, a light-reflecting rotary encoder can be provided with no shift in the timing between the clicking detent sensation and pulse signal generation and with a long useful life without any deterioration in the clicking detent sensation.

We claim:

1. A light-reflecting rotary encoder comprising: a circular pulse plate which is made from a thin sheet of iron material and on which glossy reflective portions and non-reflective slits are disposed alternately and continuously at a fixed radius from the center of the circular plate; an optical element of reflective detector type which consists of a light-emitting element and a light-receiving element and is positioned so as to oppose the pulse plate on one side of the slits; a ring-shaped magnetic plate which faces the pulse plate on the opposite side to the optical element and at a fixed gap from the entire circumference of the reflective portions and slits of the circular pulse plate, said ring-shaped magnetic plate being magnetized at positions facing the reflective portions on the pulse plate; and an operating shaft which rotates the pulse plate.

2. A light-reflecting rotary encoder according to claim 1, wherein the surfaces of the magnetic plate and other components facing the optical element through the pulse plate are made flat black to prevent reflection of light.

3. A light-reflecting rotary encoder comprising: a circular pulse plate which is made from a thin sheet of iron material and is divided in the radial direction from the center of the circular plate into equal parts at which glossy reflective portions and non-reflective slits are alternately provided; an optical element of reflective detector type which consists of a light-emitting element and a light-receiving element and is positioned so as to oppose the pulse plate on one side of the slits; magnets which are disposed so as to oppose the slits of the pulse plate on the same side as the optical element but at different positions; and an operating shaft which rotates the pulse plate.

4. A light-reflecting rotary encoder according to claim 3, wherein a plurality of fan-shaped magnets having equal magnetic forces are positioned opposite to each other at evenly spaced positions at the same radius as the reflective portions and slits of the circular pulse plate.

5. A light-reflecting rotary encoder according to claim 3, wherein each of the fan-shaped magnets has magnetic portions and a non-magnetic portion positioned at the same angular pitch as the reflective portions and slits of the circular pulse plate.

6. A light-reflecting rotary encoder according to claim 4, wherein each of the fan-shaped magnets has magnetic portions and a non-magnetic portion positioned at the same angular pitch as the reflective portions and slits of the circular pulse plate.

* * * * *